US 9,091,203 B2

(12) United States Patent
Geradts et al.

(10) Patent No.: US 9,091,203 B2
(45) Date of Patent: Jul. 28, 2015

(54) OPERATION OF AN INTERNAL COMBUSTION ENGINE

(75) Inventors: Karlheinz Geradts, Staufen (CH); Werner Sonnleitner, Ahnatal (DE)

(73) Assignee: Bombardier Transportation GmbH, Berlin (DE)

( * ) Notice: Subject to any disclaimer, the term of this patent is extended or adjusted under 35 U.S.C. 154(b) by 172 days.

(21) Appl. No.: 14/001,276

(22) PCT Filed: Feb. 22, 2012

(86) PCT No.: PCT/EP2012/053003
§ 371 (c)(1),
(2), (4) Date: Aug. 23, 2013

(87) PCT Pub. No.: WO2012/113824
PCT Pub. Date: Aug. 30, 2012

(65) Prior Publication Data
US 2013/0333636 A1 Dec. 19, 2013

(30) Foreign Application Priority Data
Feb. 25, 2011 (DE) .......................... 10 2011 004 794

(51) Int. Cl.
*F01N 5/02* (2006.01)
*F02B 63/04* (2006.01)
(Continued)

(52) U.S. Cl.
CPC .............. *F02B 63/04* (2013.01); *F01N 3/0205* (2013.01); *F01N 3/043* (2013.01); *F01N 5/025* (2013.01); *F02G 5/02* (2013.01); *F02G 5/04* (2013.01); *F28D 11/02* (2013.01); *F28D 20/02* (2013.01); *F28D 20/025* (2013.01); *F28D 20/028* (2013.01); *F28D 21/0003* (2013.01); *F28F 13/14* (2013.01); *H01L 35/30* (2013.01); *F01N 2240/02* (2013.01); *F01N 2240/10* (2013.01); *F01N 2260/024* (2013.01); *F01N 2590/08* (2013.01); *F01P 2011/205* (2013.01); *F02G 2260/00* (2013.01); *F28D 2020/0078* (2013.01); *Y02E 60/145* (2013.01); *Y02T 10/16* (2013.01); *Y02T 10/166* (2013.01)

(58) Field of Classification Search
CPC ....... F01N 3/0205; F01N 3/043; F01N 5/025; F01N 2240/02; F01N 2240/10; F01N 2260/024; F01N 2590/08; F02G 5/02; F28D 20/025; F28D 21/0003; Y02T 10/166
USPC ..................................................... 60/274, 320
See application file for complete search history.

(56) References Cited

U.S. PATENT DOCUMENTS

2005/0268955 A1 12/2005 Meyerkord et al.
2010/0186398 A1* 7/2010 Huber .............................. 60/320
(Continued)

FOREIGN PATENT DOCUMENTS

DE 102006040853 B3 2/2008
DE 102007045164 A1 4/2009
(Continued)

*Primary Examiner* — Thomas Denion
*Assistant Examiner* — Jorge Leon, Jr.
(74) *Attorney, Agent, or Firm* — The Webb Law Firm

(57) ABSTRACT

An apparatus to use waste heat from an internal combustion engine in a vehicle, wherein the apparatus has an exhaust gas line to remove exhaust gases from the internal combustion engine, the exhaust gas line is thermally connected to a high-temperature side of a thermoelectric generator, and a latent heat accumulator is thermally connected to the high-temperature side of the thermoelectric generator.

12 Claims, 3 Drawing Sheets

(51) Int. Cl.

| | |
|---|---|
| *F01N 3/02* | (2006.01) |
| *F28D 20/02* | (2006.01) |
| *F02G 5/02* | (2006.01) |
| *F01N 3/04* | (2006.01) |
| *F02G 5/04* | (2006.01) |
| *F28F 13/14* | (2006.01) |
| *F28D 11/02* | (2006.01) |
| *F28D 21/00* | (2006.01) |
| *H01L 35/30* | (2006.01) |
| *F01P 11/20* | (2006.01) |
| *F28D 20/00* | (2006.01) |

(56) References Cited

U.S. PATENT DOCUMENTS

2010/0186399 A1    7/2010   Huttinger
2012/0090293 A1    4/2012   Barrieu

FOREIGN PATENT DOCUMENTS

| EP | 0839995 A1 | 5/1998 |
| EP | 1445440 A1 | 8/2004 |
| FR | 2943731 A1 | 10/2010 |
| JP | 200583251 A | 3/2005 |
| KR | 1020100056811 A | 5/2010 |

\* cited by examiner

OPERATION OF AN INTERNAL COMBUSTION ENGINE

CROSS-REFERENCE TO RELATED APPLICATIONS

This application is the United States national phase of International Application No. PCT/EP2012/053003 filed Feb. 22, 2012, and claims priority to German Patent Application No. 10 2011 004 794.8, filed on Feb. 25, 2011, the disclosures of which are hereby incorporated by reference in their entirety.

BACKGROUND OF THE INVENTION

1. Field of the Invention

The invention relates to an apparatus for utilizing the waste heat of an internal combustion engine in a vehicle, in particular in a railway vehicle, in which the apparatus has an exhaust gas line for removing exhaust gases from the internal combustion engine and the exhaust gas line is thermally connected to a high-temperature side of a thermoelectric generator. The invention further relates to a process for operating an internal combustion engine in a vehicle, in particular in a railway vehicle, in which exhaust gases from the internal combustion engine are diverted off through an exhaust gas line and the waste heat from the internal combustion engine that is diverted off with the exhaust gases is fed into a high-temperature side of a thermoelectric generator, and the thermoelectric generator utilizes the waste heat to generate electrical energy.

2. Description of Related Art

An apparatus of this type and a process of this type are disclosed in US 2005/0268955 A1. As also described in this publication, the internal combustion engine may in particular be the traction motor of a vehicle, for example a railway vehicle. In particular, in this case the internal combustion engine generates energy (in particular by driving a mechanically driven electric generator) for the traction of the vehicle and optionally also for other devices on the vehicle. The internal combustion engine is usually thermally connected to at least one coolant circuit.

The invention relates in particular to the field of railway vehicles, in which much more powerful internal combustion engines typically are used than is the case with highway vehicles. The railway vehicle may in particular be a locomotive, for example a diesel-electric locomotive. However, use of the invention in other vehicles, such as ships, is also conceivable.

In the apparatus that is described in US 2005/0268955 A1, high fluctuations are encountered in the generation of electrical power by the thermoelectric generator. In particular, the electrical power of the generator is low when the internal combustion engine generates low mechanical power. The problem is intensified by the fact that the efficiency with which a thermoelectric generator generates electrical energy from heat depends, among other things, on the temperature level on the high-temperature side of the generator. When waste heat from the exhaust gas line of the internal combustion engine is used, though, the temperature of the exhaust gas varies greatly within a very wide temperature range.

SUMMARY OF THE INVENTION

The problem to be solved by the invention is to provide an apparatus for using the waste heat of an internal combustion engine in a vehicle, in particular in a railway vehicle, that permits the electrical power generated by the thermoelectric generator to be kept constant, at least when it is required for electrical power. Another problem to be solved by the invention is to provide a corresponding process for operating an internal combustion engine in a vehicle, in particular in a railway vehicle.

According to one of the basic principles of the present invention, a latent heat accumulator is also thermally connected to the high-temperature side of the thermoelectric generator. There are various options for charging the latent heat accumulator. In each case, however, the latent heat accumulator is able to supply heat to the high-temperature side of the thermoelectric generator so that an electrical output that cannot be generated by waste heat from the exhaust gas line, for example when the mechanical output of the internal combustion engine is low and therefore the exhaust gas temperatures are low, can at least be generated when needed.

In accordance with the invention, in order to operate an internal combustion engine in a vehicle, in particular in a railway vehicle, exhaust gases are diverted off from the internal combustion engine via an exhaust gas line, waste heat from the internal combustion engine that is diverted off with the exhaust gases is fed to a high-temperature side of a thermoelectric generator, and the thermoelectric generator utilizes the waste heat to generate electrical energy, moreover, (simultaneously and/or in other time periods) heat is fed from a latent heat accumulator to the high-temperature side of a thermoelectric generator, and the thermoelectric generator utilizes the heat to generate electrical energy.

The discharging of the latent heat accumulator preferably is controllable with respect to the discharge output. This will this be described in greater detail below. In any event, however, the possibilities for providing electrical power via the thermoelectric generator are improved by the latent heat accumulator. Therefore, for example, electrical devices that cannot be operated without electrical power or cannot be operated with little electrical power can also be connected to the thermoelectric generator, at least in certain vehicle operating phases. Of course, the availability of electrical power can be increased further by using electrical and/or electrochemical energy accumulators.

In particular, at least one electrical heating resistor can be located within the latent heat accumulator in order to charge the latent heat accumulator. If an electrical current flows through the at least one heating resistor, said resistor generates heat that charges the latent heat accumulator. A preferred source for the electrical current is an electrical generator (in particular a traction motor) that generates electrical energy when the vehicle is braked. Electrical power from the thermoelectric generator produced from exhaust gas waste heat could also be used to charge the latent heat accumulator. However, this is less effective than other processes.

Therefore it is preferable to charge the latent heat accumulator by means of an electric accumulator charging device that is operated with electrical energy generated when the vehicle is braked. Operating the electrical traction motors as electrical generators when railway vehicles are braked and using the electrical energy that is generated in this way to charge an electrical or electrochemical energy accumulator is known per se. Operating traction motors in this way as generators is also known as a so-called dynamic brake and is also done when the electrical or electrochemical energy accumulators are fully charged. In this case, the braking energy must be converted into heat by means of heating resistors in apparatuses that are disclosed in the prior art, and this heat is released into the environment so that it is no longer available for further use in the vehicle. Heat that is generated in this way is therefore advantageously transferred into the latent heat accumulator. In particular, the idea behind this is that a high-temperature latent heat accumulator (which will be described in greater detail below) has a very high storage capacity with a relatively low design volume. Therefore, operating situations in which the braking energy can no longer be used to charge the latent heat accumulator are rare.

The basic principles and embodiments of the invention are described here relative to one internal combustion engine, but they also apply in an analogous manner to a plurality of internal combustion engines. For example, a vehicle can have a number of internal combustion engines, and the waste heat from the exhaust gas lines of the internal combustion engines, or at least from a plurality of internal combustion engines, can be used in the same way as described for a single internal combustion engine.

The thermoelectric generator may specifically be a heat exchanger with integrated thermoelectric elements. A heat transfer fluid that circulates in particular in a first heat transfer circuit transports heat to the heat exchanger, which absorbs the heat on the high-temperature side of the thermoelectric elements and transfers it to the low-temperature side of the thermoelectric elements. The heat exchanger with integrated thermoelectric elements is preferably a plate-type heat exchanger.

The exhaust gas line is preferably connected thermally to a first heat transfer circuit by means of a first heat exchanger in the apparatus (which is not the heat exchanger having the thermoelectric elements). A feed path in the first heat transfer circuit runs from the first heat exchanger to the high-temperature side of the thermoelectric generator in order to connect the exhaust gas line to the high-temperature side. This has the advantage, compared with the embodiment described in US 2005/0268955 A1, in which the exhaust gases from the internal combustion engine transfer heat to the high-temperature side of the thermoelectric generator, that additional components can be thermally connected on the first heat transfer circuit (in particular of the latent heat accumulator or an exhaust gas recirculation cooler (EGR) on the internal combustion engine). Moreover, better heat transfer to the thermoelectric generator is possible with a specific heat transfer fluid. This is particularly important for effective generation of electrical energy by the at least one thermoelectric element of the thermoelectric generator. In particular, while it is possible to design the heat exchanger used to transfer the waste heat from the exhaust gas into the heat transfer fluid very effectively (for example, as a coaxial heat exchanger, tubular-, plate-, or block-type heat exchanger), thermoelectric elements cannot be integrated into a gas/fluid heat exchanger in an equally efficient manner with regard to the generation of electrical energy as that possible with a fluid heat exchanger. In particular, the thermoelectric generator can be a plate-type heat exchanger, as already noted above. Stated in more general terms, the thermoelectric generator may be a fluid/fluid heat exchanger, in which at least the fluid on the high-temperature side is preferably a liquid, specifically an oil. It is also preferred that the fluid on the low-temperature side also be a liquid. In this case, therefore, a second heat transfer circuit that carries away the heat transferred from the high-temperature side to the low-temperature side exists on the low-temperature side of the thermoelectric generator, and, for example, transfers this heat into the environment by means of a fluid/air heat exchanger.

If an expansion tank, which is also referred to as a compensation tank, is present, this tank preferably also compensates for volume fluctuations in the first heat transfer circuit. In addition, the expansion tank can also contain gas under pressure (preferably inert gas) in addition to the fluid (specifically the oil). In the case of an oil, the inert gas (such as nitrogen) prevents the oil from oxidizing. Furthermore, a relief valve can be connected to the expansion tank and can discharge oil from the expansion tank if a specified pressure is exceeded. Optionally or additionally, the pressure of the gas in the expansion tank can be controlled with the aid of a controllable valve and supply of gas kept under relatively high pressure. An additional valve may also be present for the gas in order to reduce the gas pressure.

As already noted, the electrical energy generated by the thermoelectric generator can be used to operate at least one electrical consumer in the vehicle. Accordingly, the thermoelectric generator is connected to at least one electrical consumer in the vehicle. Electrical energy is supplied to this at least one electrical consumer, in particular as needed. Here, the thermoelectric generator can be connected directly to the at least one electrical consumer (i.e. via an electrical cable, without interposing devices to convert the energy with respect to energized electrical current). However, this is not preferred. Rather, it is preferred that the direct current generated by the thermoelectric generator be supplied to a voltage transformer, which may also be referred to as a converter. The converter may be a DC/DC converter, in other words a direct-current/direct-current converter. The converter may also be a DC/AC converter, which converts a direct current on the thermoelectric generator side into an alternating current used to operate electrical devices in the vehicle. This alternating current can be used directly to supply an electrical consumer and/or it can be fed across a rectifier into the intermediate DC circuit. The side of the converter on which the thermoelectric generator is located in terms of the electrical circuitry may be referred to as the primary side. The other side of the converter is then the secondary side. On the secondary side, the converter may be connected, for example, to a vehicle intermediate DC circuit, which is typically present on locomotives and other rail traction units. Energy from an energy source is normally supplied to the intermediate DC circuit and is used in particular to supply energy for vehicle traction, another in other words for electrical traction motors. In the preferred case of a diesel-electric unit as the drive equipment in a vehicle that has a diesel engine as the internal combustion engine and whose waste heat is used in the invention as described above, and that also has an electrical generator that is driven by the diesel engine and that generates an alternating current, the alternating current from the generator is rectified and fed into the intermediate DC circuit. Electrical DC energy is taken from the intermediate DC circuit and converted in an inverter to alternating current energy to drive at least one traction motor. Auxiliary equipment in the vehicle that is not used directly for traction may be connected to the intermediate DC circuit by means of an additional inverter.

The converter may in particular be one or more MPPT (maximum power point tracking) converters for converting the primary-side input current or the input voltage to a secondary-side output voltage or an output current. Such MPPT converters are standard commercially available equipment and are used per se for use in railway vehicles. Preferably, the latent heat accumulator is connected by means of a second heat exchanger (which is not part of the thermoelectric generator) to the first heat transfer circuit. For this purpose, the feed path of the first heat transfer circuit is preferably routed via the second heat exchanger to the high-temperature side of the thermoelectric generator so that the second heat exchanger thermally connects the feed path to the latent heat accumulator.

This allows the latent heat accumulator to be discharged via the second heat exchanger and the heat that is discharged to be fed to the high-temperature side of the thermoelectric generator. In this way the high-temperature side of the thermoelectric generator can be supplied with heat in a more constant manner and over longer time periods.

A control device for the apparatus is preferably provided and designed to cause the latent heat accumulator to discharge across a heat exchanger, in particular the aforesaid second heat exchanger. The heat that is taken from the latent heat accumulator via the discharge operation is supplied to the high-temperature side of the thermoelectric generator.

As will be described below in greater detail, in order to control a discharging of the latent heat accumulator, a tank of the latent heat accumulator and a heat exchanger, via which heat can be removed from the latent heat accumulator, are moved relative to each other. The transfer of heat from a latent heat storage medium of the latent heat accumulator to a heat transfer medium of a heat transfer circuit, in particular of the first heat transfer circuit, depends on the relative position of the latent heat transfer medium and the heat exchanger. This makes it possible to increase or decrease the heat transfer and, in particular, it is also possible to almost completely prevent the transfer of heat from the latent heat storage medium to the heat transfer medium. In this state, the only reason that the latent heat accumulator loses heat is that even the best thermal insulation cannot prevent some loss of heat. However, with a latent heat accumulator, such a loss of heat is very low relative to the heat storage capacity and also relative to the heat transfer rate when heat is removed.

As already noted, the heat transferred from the high-temperature side to the low-temperature side of the thermoelectric generator can be transported away by a second heat transfer circuit connected to the low-temperature side of the thermoelectric generator. The second heat transfer circuit transfers heat to a heat sink, for example the ambient air, during operation of the thermoelectric generator.

In order to avoid cold-starting an internal combustion engine, the engine is normally preheated using the engine's coolant circuit. For this purpose, preheating devices, which usually generate heat by burning the same fuel that is burned to operate the internal combustion engine and that heat the coolant in the coolant circuit, are used. Circulating the heated coolant brings the heat to the internal combustion engine. Use of preheating devices causes additional fuel consumption and additional exhaust gas emissions.

Another possible way to preheat coolant is to use latent heat accumulators. For example, the use of a paraffin or salt solution accumulator is known in highway vehicles. The latent heat storage medium paraffin has a temperature level of about 100° C. when the accumulator is in the fully charged state.

Such latent heat accumulators require a large design volume in order to store the heat needed for the preheating. The weight of such accumulators is also considerable. A further disadvantage is that the accumulators can only discharge slowly, in other words, the preheating process takes considerable time to complete. In particular, the latent heat storage medium paraffin has low thermal conductivity. Therefore, high-power internal combustion engines cannot be heated within a reasonable time and with a reasonable design volume and weight with prior-art latent heat accumulators.

The second heat transfer circuit is preferably thermally connected to a coolant circuit on the internal combustion engine across a third heat exchanger. This allows heat to be fed from the latent heat accumulator to the high-temperature side of the thermoelectric generator, to be transferred from the high-temperature side to the low-temperature side (whereby preferably no electrical current or only low electrical current is used by the thermoelectric generator), and it allows the heat to be fed via the second heat transfer circuit and the third heat exchanger to the coolant circuit of the internal combustion engine. In this way the internal combustion engine can be preheated after a break in operation or when it is first started.

However, the second heat transfer circuit and the third heat exchanger can also be used for an additional purpose or, optionally, only for one purpose, in other words not to preheat the internal combustion engine. To accomplish this, a heat exchanger that is normally present in the coolant circuit is used to transfer heat to a heat sink (for example, the ambient air), namely in addition to a heat exchanger in the second heat transfer circuit. This means that it is better to feed the heat that is to be diverted off from the low-temperature side of the thermoelectric generator to a heat sink or to various heat sinks, in particular in certain operating situations. When a railway vehicle is being operated, such operating situations are encountered in particular when the outside temperature, in other words the temperature of the ambient air into which the heat is to be passed, is very high, and/or if the railway vehicle is still standing still or traveling at low speed and the internal combustion engine nevertheless needs to be operated at a relatively high mechanical power.

In order to be able to control the transfer of heat from the second heat transfer circuit across the third heat exchanger into the coolant circuit, a bypass may be present in parallel with the third heat exchanger, so that the heat transfer medium of the second heat transfer circuit can flow past the third heat exchanger. For example, at least one valve that makes it possible to control whether the heat transfer medium flows through the bypass and/or through the third heat exchanger is to be provided.

The basic principles and embodiments of an apparatus of the invention as well as a process of the invention were described above and will also be described below. A corresponding process can be derived from the description of the apparatus, and vice versa. Preferred embodiments of the process, if not already literally described, may also be derived from the patent claims included in the specification.

A latent heat storage medium that has the highest possible phase transition temperature and that is higher than the maximum permissible coolant temperature in a coolant circuit of the internal combustion engine is preferably used. It is preferred that the phase transition temperature be at least 100 K above the maximum permissible coolant temperature, in other words significantly above this temperature. For example, the maximum permissible coolant temperature is 100° C. with water and 300° C. with oil. Therefore, depending on the coolant, a latent heat storage medium that has a phase transition temperature of more than 200° C. or more than 400° C. is selected. Optionally, or additionally, the exhaust gas temperature of the internal combustion engine is considered in selecting the storage medium and, therefore, the phase transition temperature. A phase transition temperature that is greater than the exhaust gas temperature of the internal combustion engine operated at wide-open throttle is preferred.

Aluminum, which at normal ambient pressure has a phase transition temperature of about 660° C. for the phase transition from solid to liquid is more preferred as the latent heat storage medium. Aluminum is well suited for use as a storage medium because it conducts heat very well, particularly in the liquid state, but also in the solid state. This also applies to a lesser extent to other metals that may be used as a latent heat storage medium as alternatives to or in addition to aluminum. The high thermal conductivity of metals permits particularly fast charging and particularly fast discharging of the accumulator. The temperature of the storage medium within the accumulator is also very homogeneous; in other words, the temperature differences in the accumulator are very low.

Moreover, it is preferred that the transfer of heat from the storage medium of a latent heat accumulator to the cooling medium in the coolant circuit be controllable. With a latent heat accumulator that is charged in the same way, better heat transfer means higher heat flux and vice versa. The ability to control the heat transfer allows other latent heat storage media to be used, in particular materials that have a storage-related phase transition (for example, from solid to liquid) at higher temperatures than those known for prior-art accumulators, for example paraffin accumulators. However, the ability to control the transfer has the advantage, even with latent heat accumulators with storage media that are already known per se, that higher heat fluxes are possible if the accumulator is designed accordingly, in other words has a larger surface area through which the heat transfer takes place. By controlling the heat transfer, the heat that is transferred into the coolant can be reduced if no preheating is required. In the case of identical temperature conditions but different heat transfer, the heat transfer corresponds to the heat transferred per unit time, in other words the thermal output. However, since different temperature conditions generally prevail with different latent heat accumulators using different storage media, the heat transfer described here corresponds to an effective overall heat transfer coefficient of the materials involved in the transfer.

In particular to control the heat transfer, it is proposed that a latent heat accumulator tank that contains the latent heat storage medium be moved relative to the coolant circuit so that the heat transfer surface area and therefore also the heat flux change due to the differences in the relative positions of the tank and the coolant circuit. The heat transfer surface area is understood to mean an area perpendicular to the direction of heat flow through which the heat is transferred from the heat storage medium into the coolant. By moving the tank and the coolant circuit relative to each other, the size of this heat transfer surface area is changed. If, as in the case of one of the preferred embodiments, materials having different thermal conductivities are present in the area of the exterior surface of the accumulator, namely materials that provide good thermal insulation and materials that provide good heat transfer, only the portion of the exterior surface characterized by materials with good heat transfer is referred to as the heat transfer surface area. A small amount of heat is also transferred into the coolant through the materials offering good thermal insulation. However, this portion is negligible.

The tank can be moved in order to adjust the size of the heat transfer surface area. However it is optionally or additionally possible to move a portion of the coolant circuit and/or a heat exchanger or a portion of a heat exchanger in order to transfer the heat from the latent heat storage medium into the coolant. In the event that at least one thermal insulating material is also moved between the coolant circuit and the latent heat storage medium, this material may be considered to be part of the heat exchanger. If the thermal insulating material is located in a position in which it prevents the heat transfer, the heat exchanger will have poor thermal conductivity. In particular, the thermal conductivity is improved by gradually removing the thermal insulating material, so that a preheating of the coolant can occur.

However, it is preferred that the tank containing the latent heat storage medium be moved in order to adjust the heat transfer surface area.

BRIEF DESCRIPTION OF THE DRAWINGS

Examples of embodiments of the invention will now be described with reference to the enclosed drawing. The individual figures in the drawing schematically show.

DESCRIPTION OF THE INVENTION

Figure 1:
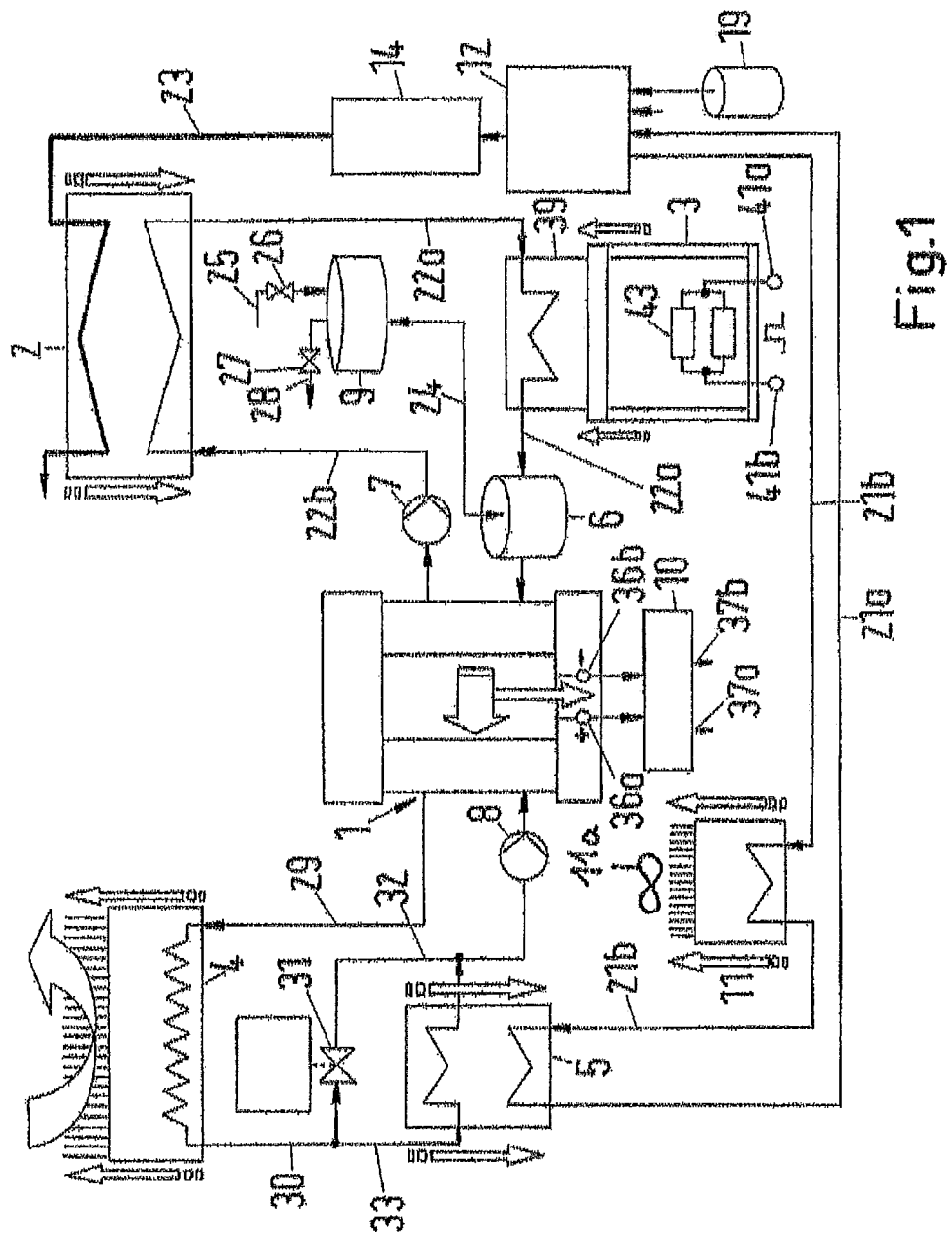
FIG. 1 a first embodiment of the invention with an internal combustion engine.

FIG. 1 shows various components of a system for using waste heat in the operation of an internal combustion engine 12, in which the internal combustion engine 12 in particular is an engine that supplies the energy for the traction of the vehicle. The internal combustion engine 12 is connected to a device 14 for the downstream treatment of the exhaust gases of the internal combustion engine 12. The device 14 may comprise one or more of the following devices: An exhaust gas recirculation line (EGR), a diesel particulate filter, an oxidation catalyst, or some other catalyst device, in particular an SCR (selective catalytic reduction) device.

The device 14 for downstream exhaust gas treatment communicates on the outlet side by means of an exhaust gas line 23, which passes through a high-temperature side of a first heat exchanger 2, with a muffler, which is not shown in detail in FIG. 1.

On the low-temperature side of the first heat exchanger 2 a heat exchange fluid, preferably an oil, circulates through a first heat transfer circuit 22, having feed path 22a and return path 22b. The feed path 22a runs from the first heat exchanger 2 through a second heat exchanger 39 and through an oil reservoir 6 to the high-temperature side of the thermoelectric generator 1 The return path 22b runs from the high-temperature side of the thermoelectric generator 1 through a circulation pump 7 in order to circulate the heat exchange fluid through the first heat transfer circuit 22 back to the low-temperature side of the first heat exchanger 2.

The heat exchange fluid may absorb heat from a latent heat accumulator 3 via the second heat exchanger 39. It is also conceivable that the latent heat accumulator 3 is charged via the second heat exchanger 39. However, this is not preferred in normal operation of the vehicle, or in any event is only preferred in operating situations in which the latent heat accumulator 3 is completely or almost completely discharged. Rather it is more preferred that a device 43 for electrically charging the latent heat accumulator 3 be present within the latent heat accumulator 3. For example, electrical current flows through electrical heating resistors in device 43 that are connected via electrical connections 41a, 41b to an electrical connection line. It is also preferred that the device 43 is operated with electrical current generated when the vehicle is braked with the electrical traction motor operating in generator mode. When traction occurs, this at least one electrical traction motor is supplied in the preferred embodiment with electrical energy from a further electrical generator (for example, the generator of a diesel-electric drive apparatus of a locomotive). This generator in turn is driven by the internal combustion engine 12. Optionally or in addition to using the braking energy, other electrical energy may also be used to operate the device 43.

The oil reservoir 6 is connected by means of a line 24 with an expansion tank 9. In a specific embodiment, a portion of the volume of the expansion tank 9 is pressurized by an inert gas, which can be fed in or discharged via a valve 26 and a gas connection 25. In addition, the oil volume of the expansion tank 9 is connected via a valve 27 with an outlet 28, in particular in order to be able to drain oil from the expansion tank 9 in specific operating situations. This apparatus ensures that there is uniform oil pressure within the first heat transfer circuit 22.

The pump 7 may also be provided at a different location in the heat transfer circuit 22. Additional pumps may also be provided, or pumps may not be used within the circuit 22, although this is not preferred, if the circulation of the heat transfer fluid is possible as a result of the differences in density that result from different temperatures.

As indicated by a wide arrow that points from the right to the left, when the apparatus is operating, heat flows from the high-temperature side of the thermoelectric generator 1 to its low-temperature side. This produces electrical energy, which is diverted off by means of electrical connections 36a (identified by a plus sign) and 36b (identified by a minus sign) to a DC/AC to direct-current/alternating current inverter 10 and to corresponding alternating current connections 37a, 37b of the inverter 10 for further use.

The low-temperature side of the thermoelectric generator 1 is connected to a second heat transfer circuit 29, 30. In this second heat transfer circuit 29, 30, a heat transfer fluid, which in particular is driven by a pump 8, circulates near the low-temperature side of the thermoelectric generator 1. By means of the branch 29 of the second heat transfer circuit 29, 30, the heat transfer fluid arrives at the high-temperature side of a fluid/air heat exchanger 4 that at least partially transfers the heat that is transported away from the thermoelectric generator 1 into the ambient air. The heat transfer fluid may be returned through two different sections of the circuit 29, 30. At a branching point in the return path 30, a section 32 of the circuit, which leads via a bypass valve 31 and via the pump 8 back to the low-temperature side of the generator 1, begins. In addition, at the branching point in the return path, a section 33, which also leads via a high-temperature side of a third heat exchanger 5 via the pump 8 to the low-temperature side of the generator 1, begins. By controlling the valve 31 (the control is represented schematically by a square above the valve 31 in FIG. 1), flow through the high-temperature side of the third heat exchanger 5 can be controlled. When the bypass valve 31 is fully open, only very little or no heat transfer fluid flows through the high-temperature side of the heat exchanger 5 because the resistance to flow in the heat exchanger 5 is greater than that in the section running through the bypass valve 31.

The low-temperature side of the heat exchanger 5 is part of a cooling circuit 21 of the internal combustion engine 12. The feed path 21a of the cooling circuit 21 leads to the internal combustion engine 12 in order to cool the engine when the coolant circuit is operating. The return path 21b runs from the internal combustion engine 12 through a fourth heat exchanger 11, which like heat exchanger 4 is a fluid/air heat exchanger, to the low-temperature side of the third heat exchanger 5. When the third heat exchanger 5 is operated, this heat exchanger transfers heat from the second heat transfer circuit 29, 30 to the heat transfer fluid in coolant circuit 21 in order to preheat the internal combustion engine 12. During normal cooling operation, in particular when the internal combustion engine has reached its normal operating temperature, heat transfer fluid also circulates in the cooling circuit 21, although the third heat exchanger 5 is not in operation. Waste heat from the internal combustion engine 12 is then discharged into the ambient air via the fluid/air heat exchanger 11 in the return path 21b of the cooling circuit 21.

In addition, FIG. 1 also shows a fuel tank 19, in particular a diesel fuel tank if the internal combustion engine 12 is a diesel engine.

Figure 2:
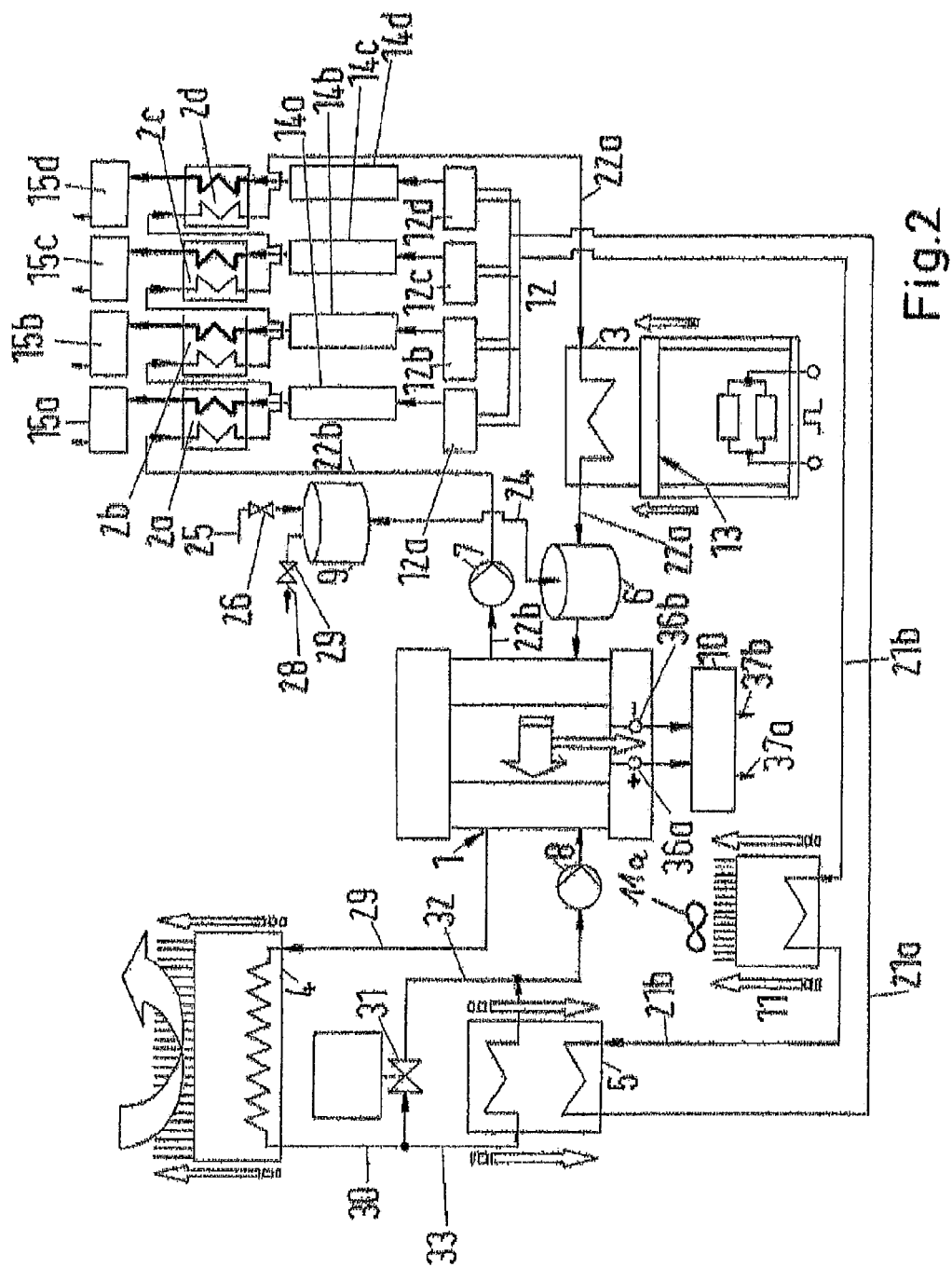
FIG. 2 a second embodiment of the invention with a plurality of internal combustion engines, and FIG. 3 a latent heat accumulator and a heat exchanger for discharging the latent heat accumulator

FIG. 2 shows a variant of the arrangement represented in FIG. 1. Only the differences are explained below. All of the other components and devices in the apparatus are identical to the components and devices shown in FIG. 1, and they are specifically operated in the same manner.

FIG. 2 does not show a fuel tank, even though at least one such tank is present. Four internal combustion engines 12a, 12b, 12c, 12d are shown. These engines are collectively identified as the drive unit by means of reference number 12. Each of these internal combustion engines 12 is connected by means of a device 14a, 14b, 14c, 14d to the downstream exhaust gas treatment system with an exhaust gas line that in each case runs via a first heat exchanger 2a, 2b, 2c, 2d to a muffler 15a, 15b, 15c, 15d through which the respective exhaust gas is discharged into the environment. The downstream exhaust gas treatment devices 14a to 14d may be designed in the same manner and may operate like device 14 from FIG. 1.

A heat transfer fluid, which circulates through the first heat transfer circuit 22a, 22b, flows in series through the first heat exchangers 2a to 2d. This heat transfer circuit 22 differs from that shown in FIG. 1 solely in that the low-temperature side of the first heat exchanger 2 from FIG. 1 is replaced by the in-series arrangement of heat exchangers 2a to 2d.

Both in its feed path as well as in its return path, the cooling circuit 21 branches into four branches, and in the feed path 21a the four branches lead to the internal combustion engines 12a to 12d, and in the return path 21b the four branches of the internal combustion engines 12a to 12d merge at the branching point and lead to the common run of the return path 21b.

The arrangements shown in FIG. 1 and FIG. 2 function, for example, as follows:

As soon as the internal combustion engine 12 or 12a to 12d has been started, the at least one circulation pump 7 is turned on, and the pump circulates heat transfer fluid in the first heat transfer circuit 22. The hot exhaust gases pass through the first heat exchanger 2 or 2a to 2d into the heat transfer circuit 22. Accordingly, the thermoelectric generator 1 produces electrical energy that is available in particular for the vehicle's electrical system, for example a locomotive with attached cars. The waste heat that is present at the low-temperature side of the thermoelectric generator 1 is transported away by the heat transfer fluid of the second heat transfer circuit 29, 30 and is at least partially discharged into the environment as described above via the fluid/air heat exchanger 4.

Depending on the rpm of the internal combustion engine 12 or upon some other operating mode, the temperature of the exhaust gas as well as the exhaust gas volumetric flow varies. The thermal output with which the heat is brought into the first heat transfer circuit 22 therefore depends on the operating mode of the at least one internal combustion engine. By closed- or open-loop control of the at least one transfer pump 7 in the first heat transfer circuit 22, the temperature of the heat transfer fluid at the high-temperature side of the generator 1 can be kept at a constant value or within a narrow temperature range. In this way, the conversion of heat to electrical energy by the thermoelectric generator 1 is optimal. This applies in particular when a locomotive or other railway vehicle is traveling and therefore when traction energy is supplied by the at least one internal combustion engine, either repeatedly or continuously.

When the vehicle is braked, at least one electrical traction motor can produce electrical energy in generator mode and can provide this energy to the vehicle's electrical system and/or directly for charging the latent heat accumulator 3. In particular, when the latent heat accumulator 3 contains aluminum as a latent heat storage medium, the contents of the accumulator can be heated to up to 750° C. When the accumulator is charged, the aluminum starts to melt beginning at 660° C. If all of the aluminum in the accumulator has been liquefied, the temperature increases to the maximum storage temperature. The charging of the accumulator is then stopped. The size of the accumulator, in other words the accumulator capacity, is to be dimensioned in such a way that, when the vehicle is braked to stop from the maximum permissible speed, the braking energy that is available can be used for charging the latent heat accumulator in any operating phase.

After such a braking operation, the latent heat accumulator is preferably discharged until it is available for a further braking operation from maximum vehicle speed, i.e. it can once again absorb the corresponding braking energy. When the latent heat accumulator is discharged, energy that in particular is supplied to the vehicle's electrical system is generated by the thermoelectric generator 1.

The types of operation that were described above are not limited to the operation of the arrangements represented in FIG. 1 and FIG. 2. In fact, they can be implemented in any other embodiment in which a latent heat accumulator that can be discharged across a thermoelectric generator is provided.

In the case of the aluminum latent heat accumulator, the discharging of the accumulator preferably is stopped when the temperature of the aluminum falls below 660° C. One option for adjusting the transfer of heat from the storage medium in the latent heat accumulator to a heat transfer circuit, in particular to the heat transfer circuit 22 represented in FIG. 1 or FIG. 2, is described in FIG. 3.

The latent heat accumulator can be thermally insulated very well, so that the heat losses are low when operation of the vehicle is interrupted for a relatively long time. When the vehicle is shut off after a relatively long operating phase, the latent heat accumulator is generally fully charged or almost fully charged because the last activity was braking to stop. The stored heat energy can still be used for a number of days to preheat the internal combustion engine. Therefore, the operation of a preheating device that also consumes fuel is not necessary.

In the particular case of low vehicle speed or when the vehicle is stopped, a fluid/air heat exchanger (heat exchanger 4, for example) that is to be used to transfer waste heat from the thermoelectric generator to the environment cannot transfer sufficient heat to the environment. In this case, the bypass valve 31 in FIG. 1 or FIG. 2 may be closed, which causes the heat transfer fluid in the second heat transfer circuit 29, 30 to flow through the high-temperature side of the third heat exchanger and transfer heat to the cooling circuit 21.

Another case in which the bypass valve 31 is closed or nearly closed is the case of preheating the internal combustion engine. In this case, heat is diverted off from the latent heat accumulator by discharging the accumulator. This heat is transferred to the high-temperature side of the thermoelectric generator 1. In this case, however, the thermoelectric generator is not used to generate electrical energy, but instead the heat is simply transferred to the low-temperature side, carried off by means of the heat transfer fluid in the second heat transfer circuit 29, 30, and transferred to the cooling circuit 21 via the high-temperature side of the third heat exchanger 5. In this way, heat is available for preheating the internal combustion engine or internal combustion engines.

Regardless of the embodiments represented in FIG. 1 and FIG. 2, it is therefore preferred that heat be taken from the latent heat accumulator to preheat the at least one internal combustion engine and that it be transferred via the thermoelectric generator to a cooling circuit of the internal combustion engine, while in this operating phase no electrical energy is diverted off by the thermoelectric generator.

It is therefore preferred that the cooling circuit make circulation possible, either solely on the basis of density differences in its heat transfer fluid, or that a pump be used to circulate the heat transfer fluid regardless of the operation of the internal combustion engine. For example, an electrically driven pump can be used.

Figure 3:
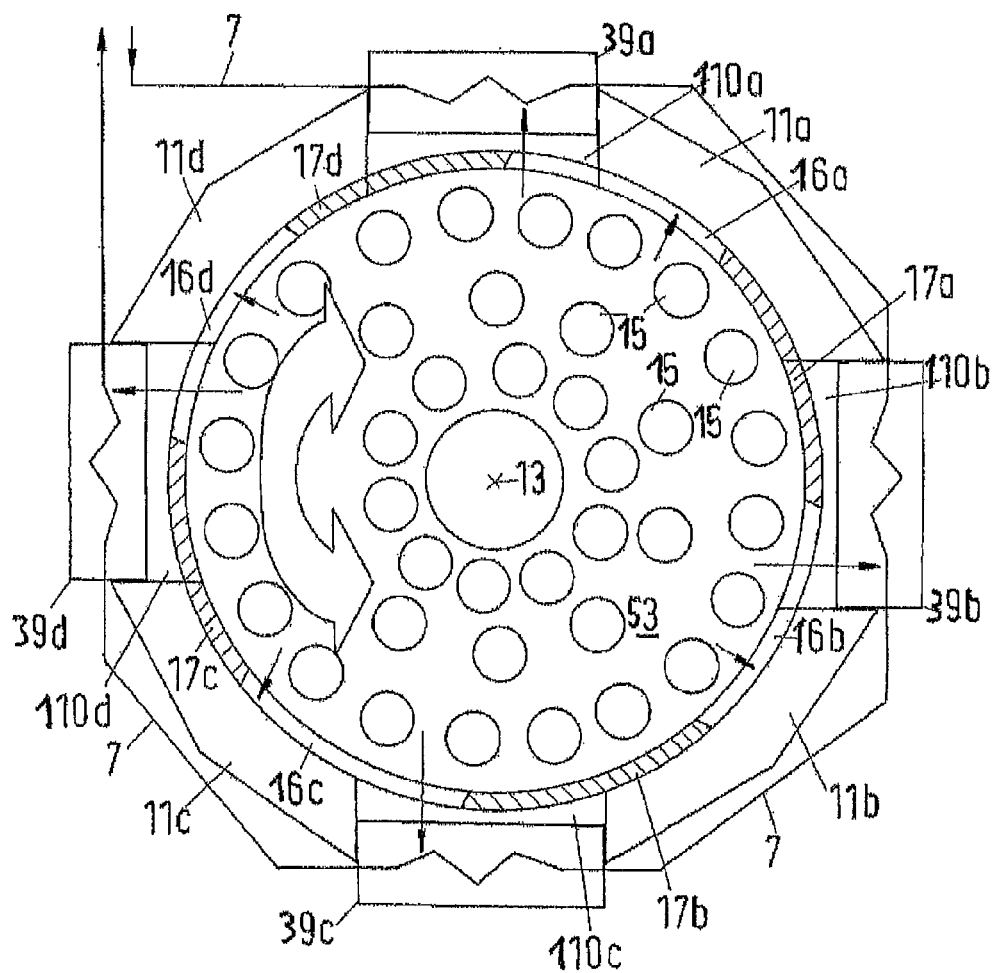

FIG. 3 shows a cross section through a latent heat accumulator in which the accumulator tank is in one of several possible rotational positions—here, in a rotational position in which a heat transfer surface area is of medium size. The accumulator tank 53 has a double-walled exterior wall, whose various segments are identified with reference numbers 16 and 17. Areas 16a, 16b, 16c, and 16d are filled with a material that has good thermal conductivity, graphite for example; by contrast, areas 17a, 17b, 17c, and 17d are filled with a thermal insulating material. The areas 16, 17 alternate between each other in the circumferential direction of the accumulator tank wall. In the example of the embodiment, four areas are shown with a material that has good thermal conductivity, and four areas are shown with a material that has good thermal insulation. It is also possible, though, to provide a different number of tank wall areas with good thermal conductivity and good insulation, respectively.

Corresponding to the number of tank wall areas that have good thermal conductivity and good insulation, the accumulator has an equal number of immobile areas 110 comprising a material that has good thermal conductivity, such as graphite. Radially outside of these areas 10 there is in each case one block heat exchanger 39a, 39b, 39c, 39d, through which a fluid is circulated in particular when the first heat transfer circuit 22 from FIG. 1 or 2 is operating, so that fluid is heated with the heat from the accumulator tank. In the circumferential direction between the areas of good thermal conducting material 110a, 110b, 110c, 110d, there are areas of thermal insulating material 11a, 11b, 11c, 11d. Like the various areas of the accumulator tank wall, these good thermal conducting areas 110 and the thermal insulating areas 11 alternate in the circumferential direction. At the same time, the good thermal conducting areas 16 of the storage tank wall extend in the circumferential direction across the same angular range as the good thermal insulating areas 110. In a possible rotational position, which is not shown, these good thermal insulating areas 16 of the accumulator tank wall and the immobile good thermal conducting areas 110 are adjacent to each other across their full surfaces. Therefore, the thermal insulating areas 17 of the accumulator tank wall and the immobile insulating areas 110 are also adjacent to each other across their full surfaces. Preferably, the angular ranges of the good thermal conducting areas of the accumulator tank wall and the angular ranges of the good thermal insulating areas 17 of the accumulator tank wall are equally large. The reason in this case is that the largest possible transfer surface for transferring heat from the interior of the accumulator to the immobile good thermal conducting areas 110 is available and the maximum possible thermal insulation effect is achieved at a different possible rotational position.

As already noted, the accumulator tank 53 can be rotated about the axis of rotation 13, which at the same time is its axis of rotational symmetry. Within the accumulator tank 53 there is a plurality of heating resistors 15, which are symbolized in FIG. 1 to FIG. 3 by circles. The latent heat storage material, aluminum in the example of the embodiment, is located between the heating resistors 15.

When the accumulator is being discharged, the heat (as indicated by a total of four long arrows that point outward in a radial direction) is transferred from the latent heat storage medium through the good thermal conducting areas 16 of the accumulator tank wall and through the good thermal conducting immobile areas 110 to the block heat exchangers 39 and thereby to the fluid flowing through the block heat exchangers 39. The fluid circuit is represented schematically and identified by the reference number 7.

A mechanical device that permits the accumulator tank to move in a rotational direction is located in the interior of the area that contains the actual latent heat storage medium. This device can be designed in various ways. Further details regarding the device are not provided here.

In the rotational position shown in FIG. 3, which was achieved by a rotation of 22.5° in the clockwise direction from the rotational position shown in FIG. 1, only a portion of the exterior surface of the good thermal conducting areas 16 of the accumulator tank wall faces the good thermal insulating areas 110 that are not included in the rotational movement. Therefore, the transfer of heat from the latent heat storage medium to the coolant in the heat exchanger blocks 39 can only occur across this portion of the exterior surface of the good thermal conducting areas 16. As a result, the heat transfer is reduced.

The invention claimed is:

1. An arrangement to use waste heat from an internal combustion engine in a vehicle, wherein
   the arrangement comprises an exhaust gas line to remove exhaust gases from the internal combustion engine,
   the exhaust gas line is thermally connected to a high-temperature side of a thermoelectric generator,
   a latent heat accumulator is thermally connected to the high-temperature side of the thermoelectric generator, wherein the latent heat accumulator is combined with an electrical accumulator charger that uses electrical energy that is produced when the vehicle is braked to charge the latent heat accumulator.

2. The arrangement of claim 1, wherein the thermoelectric generator is electrically connected to a store-charger that charges the latent heat accumulator.

3. The arrangement of claim 1, wherein
   the exhaust gas line is thermally connected via a first heat exchanger of the arrangement to a first heat transfer circuit,
   a feed path in the first heat transfer circuit runs from the first heat exchanger to the high-temperature side of the thermoelectric generator in order to connect the exhaust gas line to the high-temperature side.

4. The arrangement of claim 3, wherein the feed path runs via a second heat exchanger to the high-temperature side of the thermoelectric generator and the second heat exchanger connects the feed path thermally to the latent heat accumulator.

5. The arrangement of claim 1, wherein a controller causes a discharging of the latent heat accumulator across a heat exchanger, so that heat taken from the latent heat accumulator is fed to the high-temperature side of the thermoelectric generator.

6. The arrangement of claim 1, wherein a low-temperature side of the thermoelectric generator is connected to a second heat transfer circuit across which heat is transported off to a heat sink during operation of the thermoelectric generator, and wherein the second heat transfer circuit is thermally connected via a third heat exchanger to a coolant circuit of the internal combustion engine.

7. A process to operate an internal combustion engine in a vehicle, comprising the steps of:
   diverting exhaust gases off from the internal combustion engine via an exhaust gas line,
   feeding waste heat from the internal combustion engine that is diverted off with the exhaust gases is fed to a high-temperature side of a thermoelectric generator, and wherein the thermoelectric generator utilizes the waste heat to generate electrical energy, and
   feeding heat from a latent heat accumulator to the high-temperature side of the thermoelectric generator, and wherein the thermoelectric generator utilizes the heat to generate electrical energy,
   wherein the electrical energy that is produced when the vehicle is braked is used to charge the latent heat accumulator.

8. The process of claim 7, wherein the electrical energy produced by the thermoelectric generator is fed to at least one electrical consumer on the vehicle.

9. The apparatus of claim 7, wherein
   the waste heat is connected from the exhaust gas line via a first heat exchanger to a first heat transfer circuit, and
   the waste heat is transported from the first heat transfer circuit to the high-temperature side of the thermoelectric generator.

10. The process of claim 9, wherein heat that is diverted off from the latent heat accumulator via the first heat transfer circuit is transported to the high-temperature side of the thermoelectric generator.

11. The process of claim 7, wherein to control a discharging of the latent heat accumulator, a tank of the latent heat accumulator and a heat exchanger, via which the heat can be removed from the latent heat accumulator, are moved relative to each other, so that heat transfer from a latent heat storage medium of the latent heat accumulator to a heat transfer medium of a heat transfer circuit, is changed.

12. The process of claim 7, wherein heat from a low-temperature side of the thermoelectric generator is transported off via a second heat transfer circuit to a heat sink, and, if necessary to preheat the internal combustion engine, heat from the second heat transfer circuit is connected to a coolant circuit of the internal combustion engine.

* * * * *

UNITED STATES PATENT AND TRADEMARK OFFICE
CERTIFICATE OF CORRECTION

| | | |
|---|---|---|
| PATENT NO. | : 9,091,203 B2 | Page 1 of 1 |
| APPLICATION NO. | : 14/001276 | |
| DATED | : July 28, 2015 | |
| INVENTOR(S) | : Karlheinz Geradts et al. | |

It is certified that error appears in the above-identified patent and that said Letters Patent is hereby corrected as shown below:

In The Claims

Column 14, Line 35, Claim 9, delete "apparatus" and insert -- process --

Signed and Sealed this
Sixteenth Day of February, 2016

Michelle K. Lee
*Director of the United States Patent and Trademark Office*